United States Patent
Tseng et al.

(10) Patent No.: US 11,335,820 B2
(45) Date of Patent: May 17, 2022

(54) WAVEGUIDE PHOTOELECTRIC DETECTOR

(71) Applicant: InnoLight Technology (Suzhou) LTD., Jiangsu (CN)

(72) Inventors: Chih-Kuo Tseng, Jiangsu (CN); Xianyao Li, Jiangsu (CN); Yuzhou Sun, Jiangsu (CN)

(73) Assignee: InnoLight Technology (Suzhou) Ltd., Suzhou (CN)

( * ) Notice: Subject to any disclaimer, the term of this patent is extended or adjusted under 35 U.S.C. 154(b) by 0 days.

(21) Appl. No.: 17/038,147

(22) Filed: Sep. 30, 2020

(65) Prior Publication Data
US 2021/0111289 A1     Apr. 15, 2021

(30) Foreign Application Priority Data
Oct. 11, 2019   (CN) .................... 201910962165.X

(51) Int. Cl.
| | |
|---|---|
| *H01L 31/0232* | (2014.01) |
| *H01L 31/105* | (2006.01) |
| *H01L 31/028* | (2006.01) |
| *H01L 31/101* | (2006.01) |
| *G02B 6/12* | (2006.01) |

(52) U.S. Cl.
CPC ...... *H01L 31/02327* (2013.01); *H01L 31/028* (2013.01); *H01L 31/101* (2013.01); *H01L 31/105* (2013.01); *G02B 2006/12061* (2013.01); *G02B 2006/12123* (2013.01)

(58) Field of Classification Search
CPC ........... G02B 2006/12123; G02B 2006/12061; G02B 6/12004; G02B 6/131; H01L 31/02327; H01L 31/101; H01L 31/028; H01L 31/105
See application file for complete search history.

(56) References Cited

U.S. PATENT DOCUMENTS

| | | | | |
|---|---|---|---|---|
| 7,397,101 | B1* | 7/2008 | Masini ................ | H01L 31/028 257/184 |
| 8,809,906 | B2* | 8/2014 | Zhu ..................... | G02F 1/025 257/184 |
| 10,222,677 | B2* | 3/2019 | Yu ..................... | H01L 31/03048 |
| 2010/0080504 | A1 | 4/2010 | Shetrit et al. | |

(Continued)

FOREIGN PATENT DOCUMENTS

| | | |
|---|---|---|
| CN | 102165346 A | 8/2011 |
| CN | 103262264 A | 8/2013 |
| CN | 105762220 A | 7/2016 |

*Primary Examiner* — Andres Munoz
(74) *Attorney, Agent, or Firm* — Finnegan, Henderson, Farabow, Garrett & Dunner, LLP

(57) ABSTRACT

A waveguide photoelectric detector, comprising: a substrate comprising a silicon layer, the silicon layer having a silicon waveguide formed thereon; an active layer dispose on the silicon waveguide, the active layer having a first doped region formed thereon; a horizontal PIN junction formed at an area of the silicon layer below the active layer, the horizontal PIN junction comprising a second doped region, an intrinsic region, and a third doped region. A doping type of the second doped region is the same as that of the first doped region. One end of the second doped region near the intrinsic region is connected to the first doped region. The third doped region and the first doped region form a vertical PIN junction.

11 Claims, 4 Drawing Sheets

(56) References Cited

U.S. PATENT DOCUMENTS

2012/0126286 A1    5/2012  Na et al.
2014/0077327 A1*   3/2014  Na ..................... H01L 31/1075
                                                                257/458
2016/0155884 A1    6/2016  Hon et al.

* cited by examiner

WAVEGUIDE PHOTOELECTRIC DETECTOR

CROSS-REFERENCE TO RELATED APPLICATION

This application is based upon and claims priority to Chinese Patent Application 201910962165.X, filed on Oct. 11, 2019, the entire content of which is incorporated herein by reference.

FIELD OF THE DISCLOSURE

The present application relates to the field of optical communication technology and, more particularly, to a waveguide photoelectric detector.

BACKGROUND

A high-performance photoelectric detector is a core device in high-speed optical communication, and a waveguide optical receiver provides a significant advantage for a high level of integration. With increasing demand for bandwidth, many teams are replacing a germanium contact with a monocrystalline silicon contact to optimize electrical characteristics of metal/semiconductor contact surfaces in order to reduce contact resistance and dark current characteristics. It is expected that the overall performance will be significantly improved in comparison with a vertical structure. A research paper *–1 V bias 67 GHz bandwidth Si-contacted germanium waveguide p-i-n photodetector for optical links at 56 Gbps and beyond* (*Optics Express*, Volume 24, Issue 5, 2016) discloses a lateral PIN structure established under a silicon and germanium stack structure, in which a smaller germanium width (<0.5 μm) improves transit time for carriers. However, the narrower size will compromise optical responsivity, and therefore polycrystalline silicon needs to be added to assist with the coupling of a waveguide in order to increase optical responsivity. However, the addition of a coupler to assist with the coupling of the waveguide imposes a relatively large number of restrictions on optical modes, introduces additional polarization dependent loss (PDL), and requires more complex technology.

To address the issue of optical coupling, a patent application Method for Germanium-on-Silicon Photoelectric Detector without Germanium Layer Contact and System Thereof (CN Application No. 201510864620.4) discloses a germanium-on-silicon photoelectric detector, in which the problems of germanium size and optical coupling are controlled by epitaxial growth of a recess, to improve performance in both speed and responsivity. However, the disclosed structure creates the problem of a larger dark current (>500 nA) and affects the sensitivity of the device.

SUMMARY

Purposes of the present disclosure include providing a waveguide photoelectric detector that combines the strengths of vertical and horizontal PIN structures and offers advantages such as high transmission speed, high responsivity, and low dark current.

In order to achieve one or more aspects of the aforementioned purpose, one embodiment of the present disclosure provides a waveguide photoelectric detector, comprising a substrate comprising at least a silicon layer, the silicon layer having a silicon waveguide formed thereon, an active layer dispose on the silicon waveguide, the active layer having a first doped region formed thereon, and a horizontal PIN junction formed at an area of the silicon layer below the active layer. The horizontal PIN junction comprises a second doped region, a first intrinsic region, and a third doped region. The first intrinsic region is connected to the second doped region and the third doped region. A doping type of the second doped region is the same as a doping type of the first doped region. One end of the second doped region near the first intrinsic region is connected to the first doped region. The first intrinsic region and the third doped region are located below the active layer. The third doped region, the active layer, and the first doped region form a vertical PIN junction.

DETAILED DESCRIPTION

Figure 1:
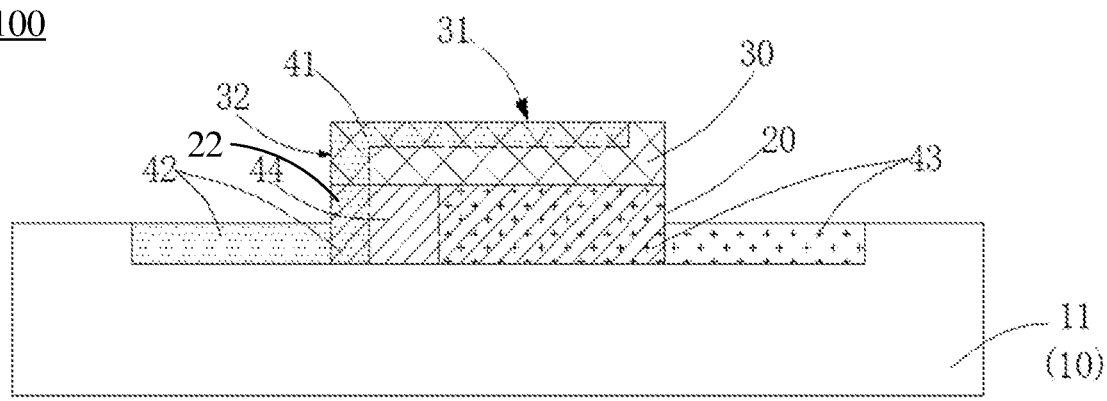
FIG. 1 is a diagram illustrating a cross section of a chip of a waveguide photoelectric detector according to a first embodiment of the present disclosure.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

In order to facilitate the presentation of the drawings in the present disclosure, the sizes of certain structures or portions have been enlarged relative to other structures or portions. Therefore, the drawings in the present application are only for the purpose of illustrating the basic structure of the subject matter of the present application.

Additionally, terms in the text indicating relative spatial position, such as "upper," "above," "lower," "below," and so forth, are used for explanatory purposes in describing the relationship between a unit or feature depicted in a drawing with another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

For an optical receiver using silicon photonics technology, there is increasing demand on the performance of germanium waveguide photoelectric detectors for high speed, high responsivity, and low dark current. The waveguide photoelectric detector provided by embodiments of the present disclosure has a horizontal PIN structure defined on a substrate whose top layer is a silicon layer. An active layer (e.g., an intrinsic germanium waveguide) is epitaxially grown on the horizontal PIN structure. A P-type doped structure is defined on the active layer, and the P-type doped structure is made to connect with a P-type doped region included in the horizontal PIN junction formed on the silicon layer. Or, an N-type doped structure is defined on the active layer, and the N-type doped structure is made to connect with an N-type doped region included in the horizontal PIN junction formed on the silicon layer. A P-type doped structure or an N-type doped structure on a waveguide of the active layer forms a vertical PIN structure with the N-type doped region or P-type doped region of the silicon layer. Such a structure combines the strengths of vertical and horizontal PIN structures, employs a vertical PIN structure and a horizontal silicon electrode contact, reduces optical absorption by metal electrodes, resolves the problem of dark current caused by contact with a germanium electrode, effectively improves the transmission speed and responsivity, and reduces the dark current. Detailed explanation is provided in the following embodiments.

First Embodiment

FIG. 1 is a diagram illustrating a cross section of a chip of a waveguide photoelectric detector 100 according to a first embodiment of the present disclosure. In the first embodiment, the waveguide photoelectric detector 100 comprises a substrate 10 and an active layer 30. The substrate 10 comprises at least a silicon layer, and a silicon waveguide 20 is formed on the silicon layer. In the first embodiment, the substrate 10 is a silicon base plate 11, and the active layer 30 is a germanium waveguide. The silicon waveguide 20 is formed on a top surface layer of the silicon base plate 11, and the active layer 30 (germanium waveguide) is epitaxially grown on the silicon waveguide 20. The active layer 30 (germanium waveguide) comprises two opposing side walls 32. A top portion 31 of the active layer 30 and at least one of the side walls 32 form a continuous first doped region 41. A horizontal PIN junction is formed at an area of the aforementioned silicon base plate 11 below the active layer 30. In the structure of the first embodiment, one horizontal PIN junction is formed below the active layer 30. In some other embodiments, two horizontal PIN junctions may be formed. The horizontal PIN junction comprises a second doped region 42, a first intrinsic region 44, and a third doped region 43. The first intrinsic region 44 is connected to the second doped region 42 and the third doped region 43. The doping type of the second doped region 42 is the same as that of the first doped region 41. One end of the second doped region 42 near the first intrinsic region 44 is connected to the aforementioned first doped region 41. The first intrinsic region 44 is located below the active layer 30, and near one of the opposing side walls 32 of the active layer 30 that connects to the second doped region 42. The third doped region 43 is located below the active layer 30 and forms a vertical PIN junction with the aforementioned first doped region 41. A ratio of a width of the aforementioned first intrinsic region 44 in a direction parallel to the substrate 10 to the thickness of the active layer 30 in a direction perpendicular to the substrate 10 is greater than or equal to 0.5. In the first embodiment, the width of the first intrinsic region 44 is equal to the distance between the third doped region 43 and the first doped region 41 forming the aforementioned vertical PIN junction, thus enabling a relatively even distribution of an electric field on the active layer 30. Alternatively, the width of the first intrinsic region 44 may be greater than the distance between the third doped region 43 and the first doped region 41 forming the vertical PIN junction, in order to increase the electric potential distribution and electric field strength of the active layer 30.

In the first embodiment, the third doped region 43 extends outside the active layer 30 along the silicon base plate 11. Metal electrodes (not shown in FIG. 1) are electrically connected to the second doped region 42 and the third doped region 43, respectively, on the silicon base plate 11 outside the active layer 30, thus avoiding contact between the active layer 30 and the metal electrodes, thereby solving the problem of a large dark current in a germanium contact structure. This effectively reduces the dark current to less than 50 nA, and improves electrical performance of the device. In addition, with the vertical PIN junction, the thickness of the active layer 30 that absorbs light may be precisely controlled in the range of 0.1 µm to 1 µm, enabling more precise control of transit time. Faster speed and lower silicon contact resistance may significantly reduce the time constant of an RC delay and further increase the speed. Additionally, in the vertical PIN junction, the transit time of photo-generated carriers is not affected by the width or size of the active layer 30. Therefore, the area that receives light on the active layer 30 may be made larger. In the first embodiment, the width of the active layer may be in the range of 0.3 µm to 20 µm, or even wider, providing a larger optical absorption area. Additionally, without optical absorption by metal electrodes on a traditional vertical PIN structure, the optical coupling efficiency is significantly higher, leading to an effective increase in the responsivity, which may reach above 0.9 A/W.

Figure 2:
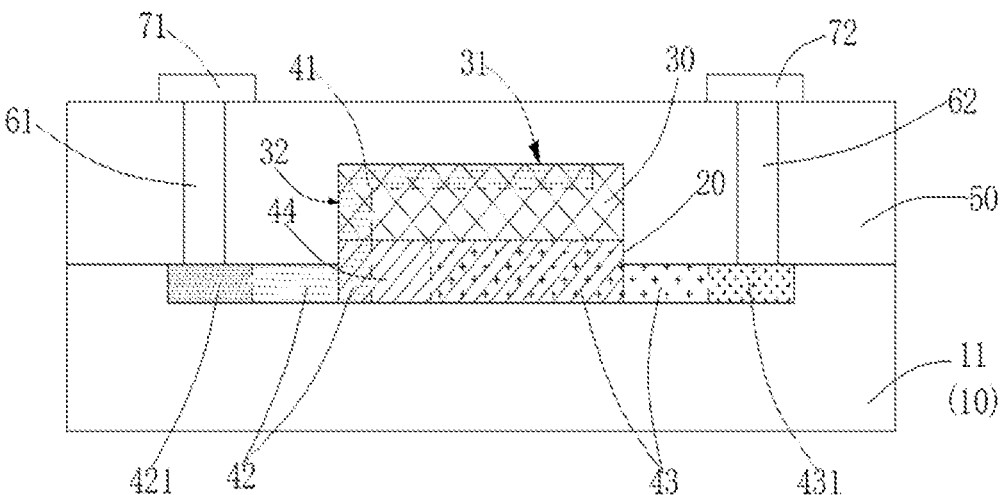
FIG. 2 is a structural diagram illustrating the waveguide photoelectric detector according to the first embodiment of the present disclosure.

FIG. 2 is a structural diagram illustrating the waveguide photoelectric detector 100 according to the first embodiment of the present disclosure. In the waveguide photoelectric detector 100 according to FIG. 2, the active layer 30 and the silicon base plate 11 are covered by a cladding layer 50. At least two metal electrodes 71 and 72 are disposed on a top surface of the cladding layer 50 to serve as an anode and an cathode, respectively. Further disposed in the cladding layer 50 are a first conductive channel 61 and a second conductive channel 62 each having an end connected to the second doped region 42 or the third doped region 43 on the silicon base plate 11 outside the aforementioned active layer 30. The other ends of the conductive channels 61 and 62 are electrically connected to the aforementioned two metal electrodes 71 and 72, respectively, to output an electrical signal produced by the detector 100. A first electrode contact area 421 may be disposed at an end portion of the second doped region 42 away from the active layer 30. A second electrode contact area 431 may be disposed at an end portion of the third doped region 43 away from the active layer 30. The aforementioned first conductive channel 61 and second conductive channel 62 are connected to the first electrode contact area 421 and the second electrode contact area 432, respectively. A doping concentration in the first electrode contact area 421 may be higher than a doping concentration in other portions (i.e., the portions other than the end portion where the first electrode contact area 421 is disposed) of the second doped region 42, and the doping concentration in the second electrode contact area 431 may be higher than the doping concentration in other portions (i.e., the portions other than the end portion where the second electrode contact area 431 is disposed) of the third doped region 43, in order to reduce the resistance in the second and third doped regions 42 and 43 and further increase the bandwidth of the detector 100.

As illustrated in FIG. 1, in the first embodiment, the way that the second doped region 42 and the first doped region 41 are connected is that a doped side wall 22 of the silicon waveguide 20 abuts a doped side wall 32 of the active layer 30. In other words, the width of the active layer 30 is less than or equal to the width of the silicon waveguide 20, and the side walls 32 of the active layer 30 are also located on the silicon waveguide 20. The second doped region 42 comprises the doped side wall 22 of the silicon waveguide 20, and the first doped region 41 comprises one side wall 32 of the active layer 30. The second doped region 42 is connected to the first doped region 41 on the active layer 30 by the doped side wall of the silicon waveguide 20 and the doped side wall 32 of the active layer 30.

Figure 3:
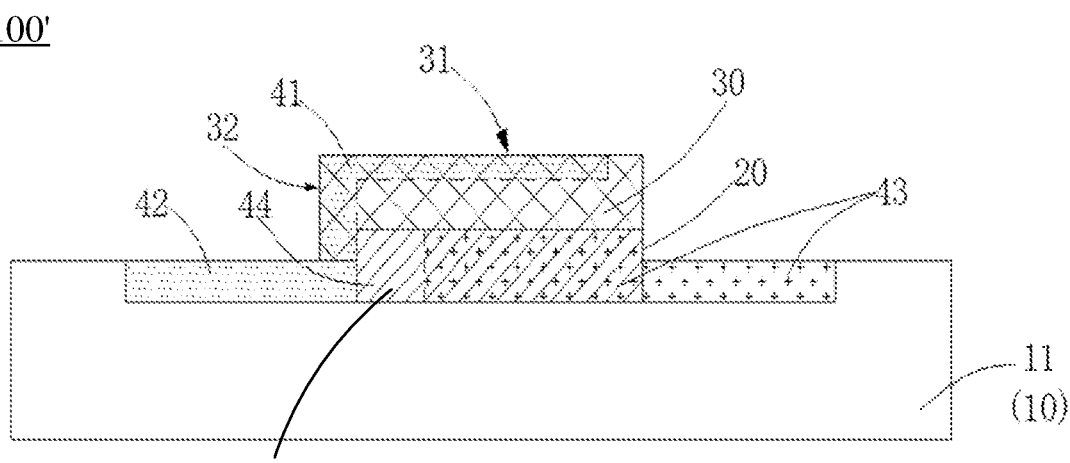
FIG. 3 is a diagram illustrating a variation of the structure of the active layer in a waveguide photoelectric detector according to a variation of the first embodiment of the present disclosure.

FIG. 3 is a diagram illustrating a variation of the structure of the active layer 30 in a waveguide photoelectric detector 100' according to a variation of the first embodiment of the present disclosure. In some other embodiments, for example, in the embodiment illustrated in FIG. 3, the doped side wall 32 of the active layer 30 may cover over the outside of the silicon waveguide 20 and extend to the silicon base plate 11 outside the silicon waveguide 20, and connect to the second doped region 42. The doping of the second doped region 42 is only on the silicon base plate 11 outside the silicon waveguide 20. The side wall 22 of the silicon waveguide 20 near the second doped region 42 forms the first intrinsic region 44. When the thickness of the side wall 32 of the active layer 30 that covers over the outside of the silicon waveguide 20 is large enough, the first intrinsic region 44 may also comprise a portion of the inside of the side wall 32 of the active layer 30 near the side wall 22 of the silicon waveguide 20. Only a surface portion of appropriate thickness of the side wall 32 of the active layer 30 is doped, and the doped surface portion is connected to the second doped region 42 on the silicon base plate 11 outside the silicon waveguide 20.

The aforementioned first doped region 41 and second doped region 42 may have P-type doping; e.g., the first doped region 41 is P+Ge, and the second doped region 42 is P+Si. The third doped region 43 has N-type doping, e.g. N+Si. Alternatively, the doping types may be the reversed. That is, the first doped region 41 is N+Ge, the second doped region 42 is N+Si, and the third doped region 43 is P+Si. As viewed in FIG. 1 through FIG. 3, the second doped region 42 is located on the left side of the silicon waveguide 20. The first doped region 41 comprises the top portion 31 and left side wall 32 of the active layer 30 and is connected to the second doped region 42 by the doped left side wall 32. In some other embodiments, the second doped region 42 may alternatively be disposed on the right side of the silicon waveguide 20, the first doped region 41 comprises the top portion 31 and a right side wall of the active layer 30 and is connected to the second doped region 42 by the doped right side wall.

In the first embodiment, the active layer 30 is a germanium waveguide. In some other embodiments, the active layer 30 may alternatively be one or a combination of a silicon layer, a germanium-silicon layer, a germanium layer, or germanium-tin layer. The germanium-silicon layer is $Si_xGe_{1-x}$, where x≤10%, and the germanium-tin layer is $Sn_xGe_{1-x}$, where x≤10%.

Second Embodiment

Figure 4:
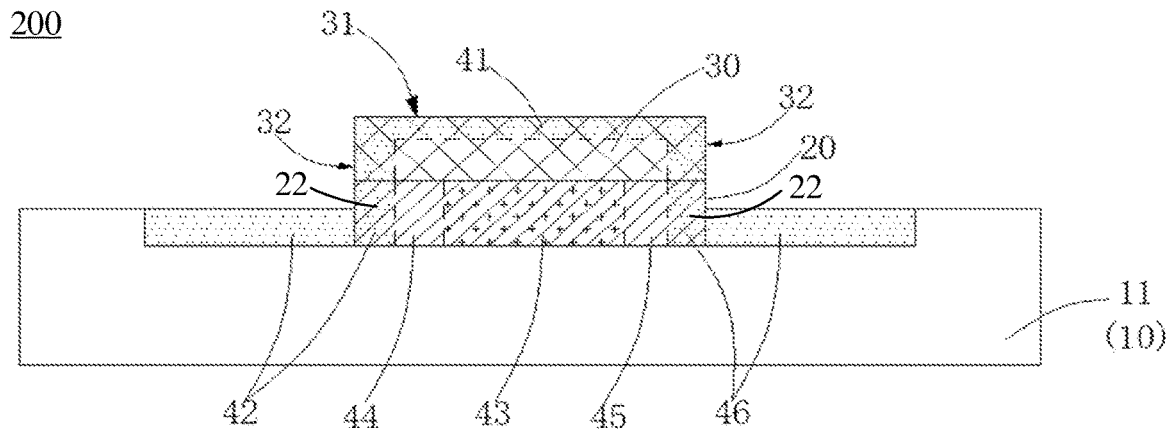
FIG. 4 is a diagram illustrating a cross section of a chip of a waveguide photoelectric detector according to a second embodiment of the present disclosure.

FIG. 4 is a diagram illustrating a cross section of a chip of a waveguide photoelectric detector 200 according to a second embodiment of the present disclosure. The second embodiment differs from the first embodiment in that the top portion 31 and the two side walls 32 of the active layer 30 form a continuous first doped region 41, i.e., the first doped region 41 comprises the top portion 31 and the two side walls 32 of the active layer 30. A second intrinsic region 45 and a fourth doped region 46 are further disposed on the silicon base plate 11. The second intrinsic region 45 is connected to the aforementioned third doped region 43 and fourth doped region 46, forming a second horizontal PIN junction. The doping type of the fourth doped region 46 is the same as that of the aforementioned first doped region 41. One end of the fourth doped region 46 near the second intrinsic region 45 is connected to the first doped region 41.

In the second embodiment, the width of the active layer 30 in the direction parallel to the substrate 10 is less than or equal to the width of the silicon waveguide 20 in the direction parallel to the substrate 10. The side walls 32 of the active layer 30 are also located on top of the silicon waveguide 20. The second doped region 42 comprises one of two doped side walls 22 of the silicon waveguide 20. The fourth doped region 46 comprises the other one of the two doped side walls 22 of the silicon waveguide 20. The second doped region 42 and the fourth doped region 46 are connected to the first doped region 41 on the active layer 30 by the two doped side walls 22 of the silicon waveguide 20, respectively. The third doped region 43 is located on the silicon waveguide 20 below the active layer 30 and forms a vertical PIN junction with the first doped region 41. Additionally, on both sides of the third doped region 43, the third doped region 43 forms horizontal PIN junctions with the second doped region 42 and the fourth doped region 46, respectively. The two horizontal PIN junctions are located on the silicon waveguide 20 near the two side walls 32 of the active layer 30, respectively.

Figure 5:
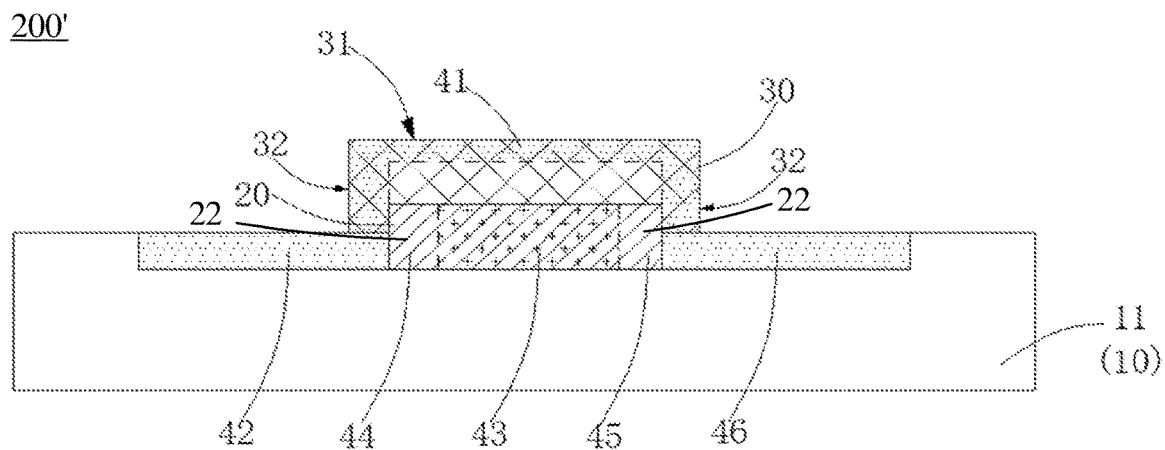
FIG. 5 is a diagram illustrating a variation of the structure of the active layer in a waveguide photoelectric detector according to a variation of the second embodiment of the present disclosure.

FIG. 5 is a diagram illustrating a variation of the structure of the active layer 30 in a waveguide photoelectric detector 200' according to a variation of the second embodiment of the present disclosure. In some other embodiments, for example, in the embodiment illustrated in FIG. 5, the doped side walls 32 of the active layer 30 may cover over the outside of the silicon waveguide 20 and extend to the silicon base plate 11 outside the silicon waveguide 20, and connect to the second doped region 42 and the fourth doped region 46, respectively. The doping of the second doped region 42 and the doping of the fourth doped region 46 are only on the silicon base plate 11 outside the silicon waveguide 20. One of the side walls 22 of the silicon waveguide 20 near the second doped region 42 forms the first intrinsic region 44, and the other one of the side walls 22 of the silicon waveguide 20 near the fourth doped region 46 forms the second intrinsic region 45. When the thickness of the side wall 32 of the active layer 30 that covers over the outside of the silicon waveguide 20 is large enough, the first intrinsic region 44 and the second intrinsic region 45 may also comprise portions of the inside of the two side walls 32 of the active layer 30 near the side walls of the silicon waveguide 20. Only surface portions of appropriate thickness of the side walls 32 of the active layer 30 are doped, and these doped portions are connected to the second doped region 42 and the fourth doped region 46 on the silicon base plate 11 outside the silicon waveguide 20.

Third Embodiment

Figure 6:
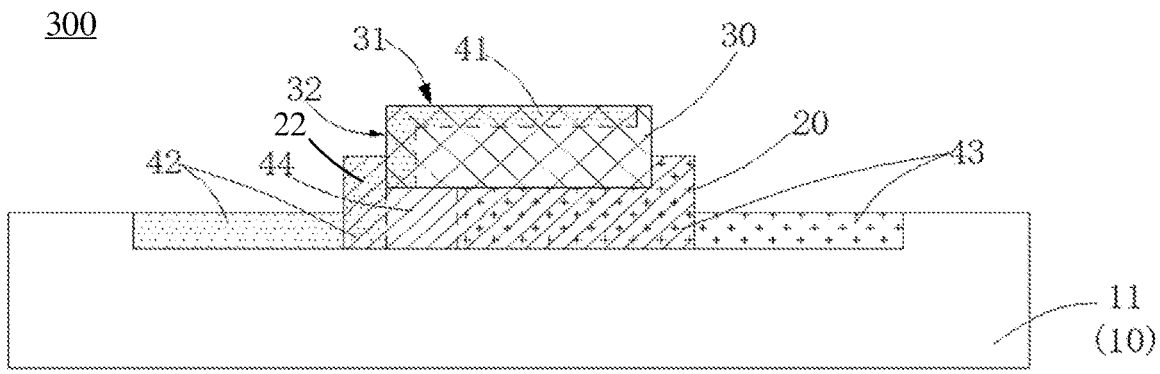
FIG. 6 is a diagram illustrating a cross section of a chip of a waveguide photoelectric detector according to a third embodiment of the present disclosure.
Figure 7:
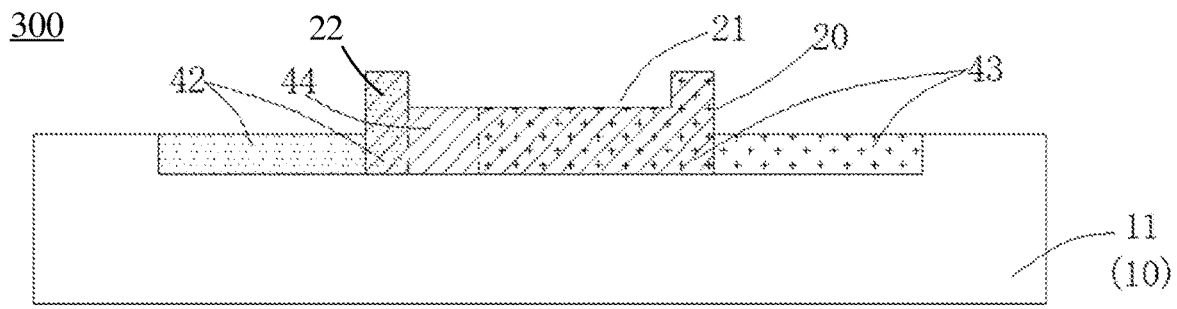
FIG. 7 is a structural diagram illustrating a substrate and a silicon waveguide according to the third embodiment of the present disclosure.

FIG. 6 is a diagram illustrating a cross section of a chip of a waveguide photoelectric detector 300 according to a third embodiment of the present disclosure. FIG. 7 is a structural diagram illustrating the substrate 10 and the silicon waveguide 20 in the waveguide photoelectric detector 300 according to the third embodiment of the present disclosure. As illustrated in FIG. 6 and FIG. 7, the third embodiment differs from the first embodiment and the second embodiment in that a groove 21 is disposed on the silicon waveguide 20 and that the active layer 30 extends from the bottom of the groove 21 to above the silicon waveguide 20. In the embodiment illustrated in FIGS. 6 and 7, the groove 21 is a double-sided groove.

Figure 8:
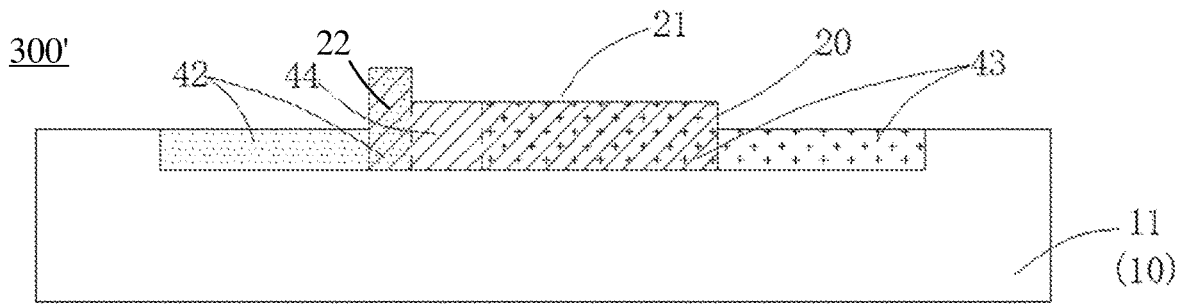
FIG. 8 is a diagram illustrating a variation of the structure of the silicon waveguide in a waveguide photoelectric detector according to a variation of the third embodiment of the present disclosure.

FIG. 8 is a structural diagram illustrating a variation of the structure of the silicon waveguide 20 in a waveguide photoelectric detector 300' according to a variation of the third embodiment of the present disclosure. In the embodiment illustrated in FIG. 8, the aforementioned groove 21 may alternatively be a single-sided groove.

In the third embodiment and the variation of the third embodiment, the active layer 30 is formed by direct upward epitaxial growth from the bottom of the groove 21 of the silicon waveguide 20. The top portion 31 and one side wall 32 of the active layer 30 are doped to form the first doped region 41. One side wall 22 of the groove 21 and a portion of the silicon base plate 11 outside the side wall 22 are doped to form the second doped region 42. The bottom of the groove 21 forms the first intrinsic region 44 and the third doped region 43. The first intrinsic region 44 is connected to the second doped region 42 and the third doped region 43. The first doped region 41 and the second doped region 42 are connected to each other by the doped side wall 32 of the active layer 30 and the doped side wall of the groove 21. The first doped region 41, the active layer 30, and the third doped region 43 form a vertical PIN junction. The second doped region 42, the first intrinsic region 44, and the third doped region 43 form a horizontal PIN junction.

In the third embodiment and the variation of the third embodiment, the aforementioned third doped region 43 also extends to the silicon base plate 11 outside the silicon waveguide 20. Portions of the second doped region 42 and the third doped region 43 located outside the silicon waveguide 20 contact metal electrodes, thus avoiding contact between the active layer 30 and the metal electrodes, thereby solving the problem of a large dark current in a germanium contact structure, effectively reducing the dark current, and improving electrical performance of the device.

Figure 9:
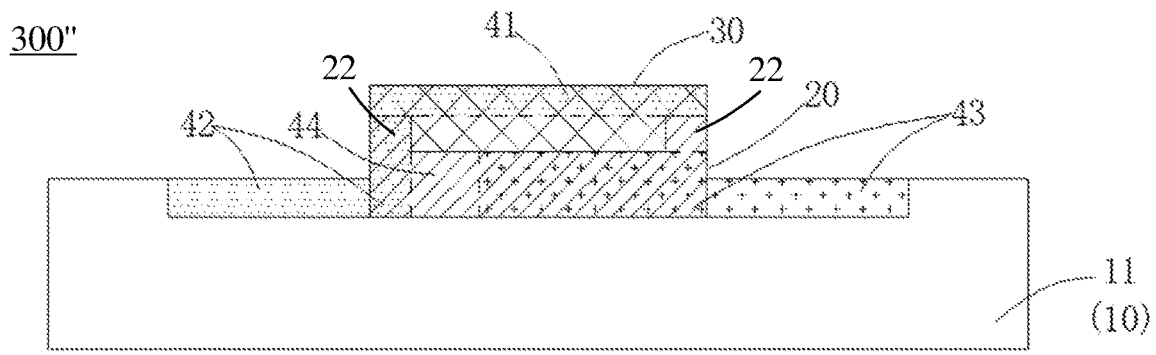
FIG. 9 is a diagram illustrating a variation of the structure of the active layer in a waveguide photoelectric detector according to another variation of the third embodiment of the present disclosure.

FIG. 9 is a diagram illustrating a variation of the structure of the active layer 30 in a waveguide photoelectric detector 300" according to another variation of the third embodiment of the present disclosure. In the embodiment as illustrated in FIG. 9, the active layer 30 may alternatively be epitaxially grown from the bottom of the groove 21 to above the groove 21 and cover the side walls of the groove 21. A portion of the active layer 30 above the groove 21 is doped to form the first doped region 41. One side wall of the groove 21 and the silicon base plate 11 outside this side wall are doped to form the second doped region 42. The first doped region 41 and the second doped region 42 are connected to each other by the aforementioned doped side wall 22 of the groove 21. The other side wall 22 of the groove 21 is not doped. The aforementioned third doped region 43 is formed only at the bottom of the groove 21 and extends toward the silicon base plate 11 outside the silicon waveguide 20.

Figure 10:
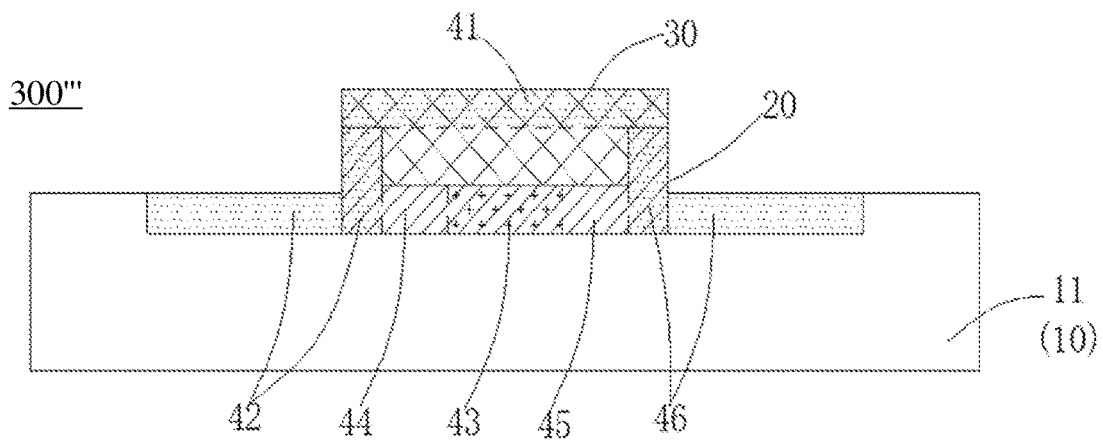
FIG. 10 is a diagram illustrating a variation of the structure of doped regions in a waveguide photoelectric detector according to still another variation of the third embodiment of the present disclosure.

FIG. 10 is a diagram illustrating a variation of the structure of the doped regions in a waveguide photoelectric detector 300''' according to still another variation of the third embodiment of the present disclosure. In the embodiment illustrated in FIG. 10, the second intrinsic region 45 and the fourth doped region 46 may further be disposed on the silicon base plate 11. The second intrinsic region 45 is connected to the aforementioned third doped region 43 and fourth doped region 46, forming a second horizontal PIN junction. The doping type of the fourth doped region 46 is the same as that of the aforementioned first doped region 41. One end of the fourth doped region 46 near the second intrinsic region 45 is connected to the first doped region 41 by contact. The aforementioned first intrinsic region 44, third doped region 43, and second intrinsic region 45, arranged sequentially, are all formed at the bottom of the groove 21 of the silicon waveguide 20.

Fourth Embodiment

Figure 11:
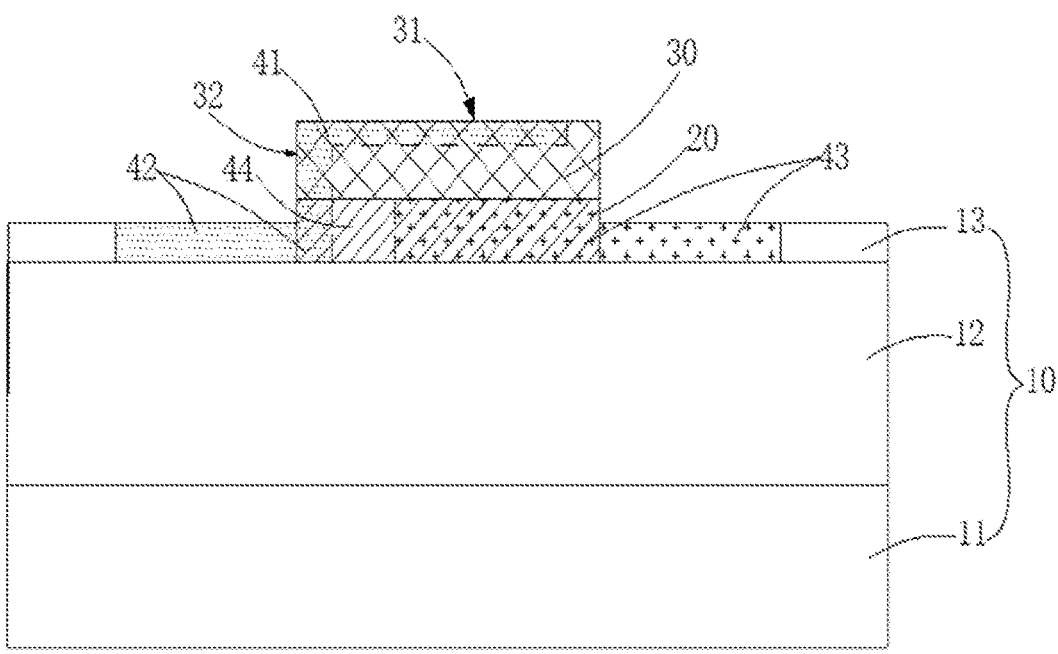
FIG. 11 is a diagram illustrating a cross section of a chip of a waveguide photoelectric detector according to a fourth embodiment of the present disclosure.

FIG. 11 illustrates a cross section of a chip in a waveguide photoelectric detector 400 according to a fourth embodiment of the present disclosure. The fourth embodiment differs from the aforementioned first through third embodiments in that the substrate 10 is a silicon-on-insulator (SOI) structure comprising, stacked sequentially, a silicon base plate 11, a buried insulation layer 12 (BOX), and a silicon top layer 13. The aforementioned silicon waveguide 20, and the intrinsic region 44, second doped region 42, third doped region 43, etc. that form a horizontal PIN junction, are formed on the silicon top layer 13.

Figure 12:
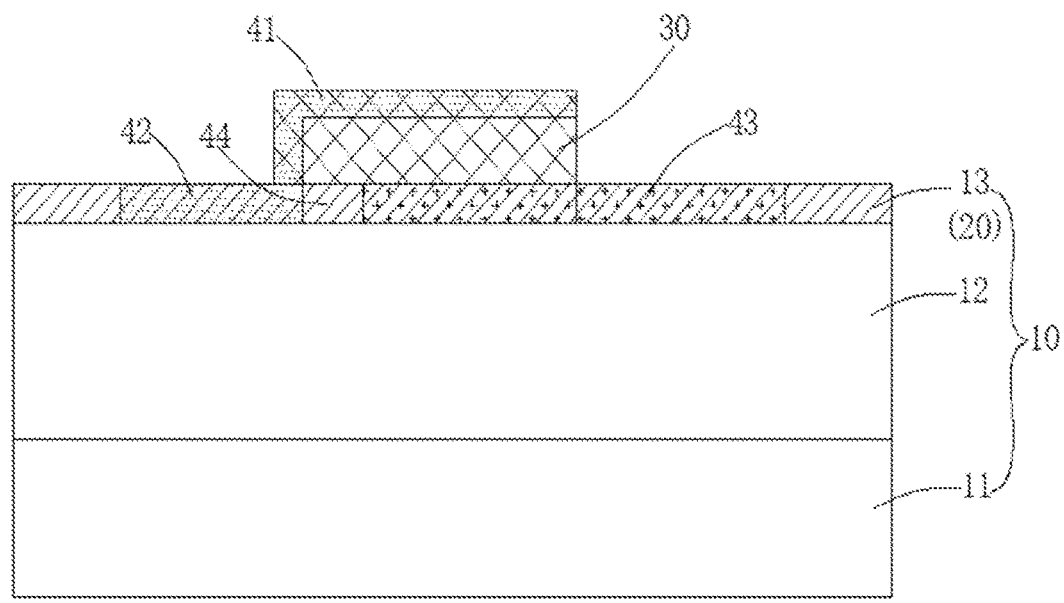
FIG. 12 is a diagram illustrating a variation of a silicon waveguide in a waveguide photoelectric detector according to an embodiment of the present disclosure.

In all of the aforementioned embodiments, the silicon waveguide 20 is a ridge waveguide. FIG. 12 is a diagram illustrating a variation of the silicon waveguide 20 in an embodiment of the present disclosure. As illustrated in FIG. 12, the silicon waveguide 20 may alternatively be a strip waveguide, which, for example, may be formed by etching the silicon layer of the substrate 10. The aforementioned second doped region 42, first intrinsic region 44, third doped region 43, and, in some cases, the second intrinsic region 45 (not shown in FIG. 12), and the fourth doped region 46 (not shown in FIG. 12) are all formed on the strip waveguide.

Alternatively, a groove may be etched on the strip waveguide, and then an active layer may be epitaxially grown upward from the bottom of the groove.

The embodiments of the present disclosure provide at least the following benefits. The embodiments of the present disclosure combine the strengths of vertical and horizontal PIN structures, employ a vertical PIN structure and horizontal silicon electrode contact, reduce optical absorption by metal electrodes, resolve the problem of dark current caused by contact with a germanium electrode, effectively improve the transmission speed and responsivity, and reduce the dark current.

The series of detailed descriptions above is only intended to provide specific descriptions of feasible embodiments of the present disclosure. They are not to be construed as limiting the scope of protection for the present disclosure. All equivalent embodiments or changes that are not detached from the technology of the present disclosure in essence should fall under the scope of protection of the present disclosure.

What is claimed is:

1. A waveguide photoelectric detector, comprising:
   a substrate comprising a silicon layer, the silicon layer having a silicon waveguide formed thereon;
   an active layer disposed on the silicon waveguide, the active layer having a first doped region formed thereon; and
   a horizontal PIN junction formed at an area of the silicon layer below the active layer, the horizontal PIN junction comprising a second doped region, an intrinsic region, and a third doped region, the intrinsic region being connected to the second doped region and the third doped region,
   wherein a doping type of the second doped region is the same as a doping type of the first doped region,
   one end of the second doped region near the intrinsic region is directly connected to the first doped region,
   the intrinsic region and the third doped region are located below the active layer, and
   the third doped region, the active layer, and the first doped region form a vertical PIN junction.

2. The waveguide photoelectric detector of claim 1, wherein the third doped region extends outside the active layer.

3. The waveguide photoelectric detector of claim 1, wherein
   the horizontal PIN junction comprising the second doped region, the first intrinsic region, and the third doped region is a first horizontal PIN junction, and
   the intrinsic region is a first intrinsic region;
   the waveguide photoelectric detector further comprising:
   a second intrinsic region and a fourth doped region are further disposed on the silicon layer, the second intrinsic region being connected to the third doped region and the fourth doped region, the third doped region, the second intrinsic region, and the fourth doped region forming a second horizontal PIN junction, and
   a doping type of the fourth doped region is the same as that of the first doped region, one end of the fourth doped region near the second intrinsic region being connected to the first doped region.

4. The waveguide photoelectric detector of claim 1, wherein a double-sided groove or a single-sided groove is disposed on the silicon waveguide, the active layer extending from a bottom of the double-sided groove or the single-sided groove to above the silicon waveguide.

5. The waveguide photoelectric detector of claim 1, wherein a thickness of the active layer is in the range of 0.1 µm to 1 µm.

6. The waveguide photoelectric detector of claim 1, wherein a width of the active layer is in the range of 0.3 µm to 20 µm.

7. The waveguide photoelectric detector of claim 1, wherein a ratio of a width of the intrinsic region to a thickness of the active layer is greater than or equal to 0.5.

8. The waveguide photoelectric detector of claim 1, wherein the active layer comprises one or a combination of a silicon layer, a germanium-silicon layer, a germanium layer, or a germanium-tin layer.

9. The waveguide photoelectric detector of claim 8, wherein when the active layer comprises the germanium-silicon layer, the germanium-silicon layer is $Si_xGe_{1-x}$, where $x \leq 0.1$; and when the active layer comprises the germanium-tin layer, the germanium-tin layer is $Sn_xGe_{1-x}$, where $x \leq 0.1$.

10. The waveguide photoelectric detector of claim 1, wherein the second doped region further comprises a first electrode contact area, the first electrode contact area being located at one end of the second doped region away from the active layer; and
    the third doped region further comprises a second electrode contact area, the second electrode contact area being located at one end of the third doped region away from the active layer.

11. The waveguide photoelectric detector of claim 1, wherein the silicon waveguide is a ridge waveguide or a strip waveguide.

* * * * *